United States Patent
Rupp

[19]

[11] Patent Number: 6,139,624
[45] Date of Patent: Oct. 31, 2000

[54] PROCESS FOR PRODUCING AN ELECTRICAL CONTACT ON A SIC SURFACE

[75] Inventor: Roland Rupp, Lauf, Germany

[73] Assignee: Siemens Aktiengesellschaft, Munich, Germany

[21] Appl. No.: 08/945,156

[22] PCT Filed: Mar. 29, 1996

[86] PCT No.: PCT/DE96/00555

§ 371 Date: Dec. 19, 1997

§ 102(e) Date: Dec. 19, 1997

[87] PCT Pub. No.: WO96/32739

PCT Pub. Date: Oct. 17, 1996

[30]     Foreign Application Priority Data

Apr. 13, 1995 [DE] Germany .......................... 195 14 081

[51] Int. Cl.[7] .......................... C30B 33/06; C30B 25/00
[52] U.S. Cl. .................................................. 117/2; 117/88
[58] Field of Search .......................................... 117/88, 2

[56]             References Cited

U.S. PATENT DOCUMENTS

| | | | |
|---|---|---|---|
| 4,402,771 | 9/1983 | Thomas | 148/174 |
| 5,010,035 | 4/1991 | Bunshah et al. | 437/100 |
| 5,114,745 | 5/1992 | Jones | 427/113 |
| 5,119,540 | 6/1992 | Kong et al. | 29/25.01 |
| 5,352,636 | 10/1994 | Beinglass | 437/235 |
| 5,667,586 | 9/1997 | Ek et al. | 117/84 |

FOREIGN PATENT DOCUMENTS 1112016   5/1968   United Kingdom .

OTHER PUBLICATIONS

Bellina, J. et al., "Thermally Activated Reactions Of Titanium Thin Films With (100) 3C–SIC Substrates," *Materials Research Society Symposia Proceedings*, vol. 97, pp. 265–270.

Muehlhoff, L. et al., "Comparative electron spectroscopic studies of surface segregation on SiC (0001) and SiC (0001)," *J. Appl. Physics*, vol. 60, No. 8, Oct. 15, 1986, pp. 2842–2853.

Bellina, J. et al., "Surface modification strategies for (100)3C–SiC," *J. Vac. Sci. Technol.*, A4(3), May/Jun. 1986, pp. 1692–1695.

Bellina, J. et al., "Stoichiometric Changes In the Surface OF (100) Cubic SiC Caused By Ion Bombardment And Annealing," *Applied Surface Science*, 25 (1986), pp. 380–390.

Dmitriev, V. et al., "Low resistivity ($\sim 10^{-5}$ $\Omega$ cm$^2$) ohmic contacts to 6H silicon carbide fabricated using cubic silicon carbide contact layer," *Appl. Phys. Lett.*, 64(3), Jan. 17, 1994, pp. 318–320.

Waldrop, J. et al., "Schottky barrier height and interface chemistry of annealed metal contacts to alpha 6H–SiC: Crystal face dependence," *Appl. Phys. Lett.*, 62(21), May 24, 1993, pp. 2685–2687.

Davis, R. et al., "A Review Of The Status Of Diamond And Silicon Carbide Devices For High–Power,–Temperature, And–Frequency Applications," *IEDM*, 90, pp. 785–788.

Nakanishi, J. et al., "Formation of ohmic contacts to p–type diamong using carbide forming metals," *J. Appl. Phys.*, 76(4), Aug. 15, 1994, pp. 2293–2298.

Bellina, Et al., "Thermally Activated Reactions of Titanium Thin Films with (100) 3C–SiC Substrates," Mat. Res. Soc. Symp. Proc., vol. 97, pp. 265–270, 1987.

Muehlhoff et al., "Comparative Electron Spectroscopic Studies of Surface Segregation in SiC (0001) and SiC (000–1)," J. Appl. Phys., vol. 60 No. 8, pp. 2842–2853, Oct. 15, 1986.

*Primary Examiner*—Benjamin L. Utech
*Assistant Examiner*—Matthew Anderson
*Attorney, Agent, or Firm*—Kenyon & Kenyon

[57]             ABSTRACT

Method for producing an electrical contact on a SiC surface A carbon coating (4), preferably a graphite coating, is first created on the silicon carbide surface (3). Said carbon coating (4) is then converted, with a carbide-forming metal (Me), into a metal carbide coating (7). The SiC/metal carbide contact produced thereby forms, in particular, an almost perfect Schottky contact.

24 Claims, 2 Drawing Sheets

PROCESS FOR PRODUCING AN ELECTRICAL CONTACT ON A SIC SURFACE

This application is a 371 of PCT/DE/00555 filed on Mar. 29, 1996, now WO 9632739A1.

BACKGROUND OF THE INVENTION

The invention concerns a method for producing an electrical contact on a silicon carbide surface.

Electrical contacts on silicon carbide (SiC) are generally produced by applying a metal, such as for example platinum, tungsten, titanium, nickel, or chromium, directly onto a SiC surface. Both ohmic contacts and Schottky contacts on SiC are known.

From *Appl. Phys. Lett.*, Vol. 65, No. 16, Oct. 17, 1994, pp. 2075–2077, a method is known for producing an ohmic contact on n-type cubic β-SiC in which a 150-nm thick coating of titanium carbide (TiC) is deposited chemically from the gas phase (chemical vapor deposition=CVD) epitactically onto a (111) surface of the β-SiC. The process gases used for this CVD process are $TiCl_4$ and $C_2H_4$.

One problem with these known methods for producing an electrical contact on a SiC surface is represented by the natural oxide formed on any exposed SiC surface in an oxygen atmosphere. In the case of ohmic contacts, this natural oxide coating increases the contact resistance. In the case of Schottky contacts, the oxide coating leads to a decrease in the contact barrier, and thus to higher leakage currents when a blocking voltage is applied. The natural oxide coating must therefore generally be removed, by sputtering or with hydrofluoric acid (HF), before application of the metal or the TiC.

From the publication Novel Refractory Semiconductors Symposium, Anaheim (US), April 21–23, 1987, Proceedings pp. 265–270, a method is known for producing an electrical contact on a SiC surface in which a carbon coating is created on a silicon carbide surface by evaporating off silicon atoms, said coating is treated with argon ions in order to remove silicon oxides, and the carbon coating is then converted, with titanium as the carbide-forming material, to titanium carbide. This method is comparatively complex due to the argon sputtering, since a separate vacuum process step is necessary.

SUMMARY OF THE INVENTION

It is the object of the invention to indicate a particular method for producing an electrical contact on a SiC surface.

This object is achieved, according to the invention, with the features of claim 1. In a first process step a carbon coating is created on the SiC surface. In a subsequent second process step, the carbon coating is converted with at least one carbide-forming metal at least largely into the corresponding metal carbide.

It is essential in this connection that before creation of the carbon coating, the silicon carbide surface is exposed to a hydrogen atmosphere at temperatures of at least 500° C. A procedure of this kind makes it possible to prevent oxides from occurring on the silicon carbide surface, which was preferably created by epitaxial growth. A separate vacuum process step is not necessary for this purpose, so that the entire method is substantially simplified.

It is known from the existing art, for example from U.S. Pat. No. 5,352,636, to remove oxide from a silicon wafer in hydrogen at 800 to 950° C. GB A 1,112,016 furthermore shows that silicon carbide is compatible with a hydrogen atmosphere.

The invention is based on the conception that an oxide coating which degrades the contact properties does not form on the carbon coating, in contrast to an exposed SiC surface. The chemical reaction of the carbon (C) with the metal yields an almost oxygen-free metal carbide/silicon carbide interface for the electrical contact.

Advantageous embodiments and developments of the method in accordance with the invention are evident from the claims which depend on claim 1.

DETAILED DESCRIPTION OF THE INVENTION

The method is particularly advantageous for producing an electrical contact on a surface of a SiC single crystal, in particular of the cubic polytype (β-SiC) or of a non-cubic polytype (α-SiC). The SiC surface used in this context is preferably the silicon basal plane or carbon basal plane of the SiC single crystal. The silicon plane corresponds in the case of an α-SiC to a (0 0 0 1) crystal surface, and in the case of β-SiC to a (1 1 1) crystal surface. The carbon plane, on the other hand, corresponds in the case of α-SiC to a (0 0 0 –1) crystal surface, and in the case of β-SiC to a (–1 –1 –1) crystal surface. The SiC single crystal is preferably produced on a substrate by chemical vapor deposition (CVD), but can also be produced by molecular beam epitaxy (MBE) or by a sublimation process. One particular variant for producing the SiC single crystal is atomic layer epitaxy (ALE), in which silicon atom layers and carbon atom layers are produced alternately in successive CVD or MBE process steps in order to build up the SiC crystal lattice.

In a particularly advantageous embodiment, the carbon layer is created by evaporating silicon atoms off from the SiC surface and/or from the SiC therebeneath. For this purpose, the SiC surface is preferably brought to a temperature of at least approximately 1000° C. in a vacuum or in an inert gas atmosphere. The carbon coating can also, however, be created by chemical vapor deposition (CVD) or molecular beam epitaxy (MBE). Preferably a carbon coating having an at least graphite-like crystal structure is created. In a preferred embodiment, the thickness of the carbon coating is set to be less than 1 nm. The carbon coating then comprises only a few atomic layers or even only one layer of carbon atoms.

The carbide-forming metal can, in particular, be applied to the carbon coating by a sputtering process or an evaporation process. In a preferred embodiment, during sputtering the kinetic energy of the accelerated metal ions or metal atoms is set to be at least as great as the energy necessary to form the metal carbide. The metal carbide then forms as soon as the metal particles strike. It is also possible, however, first to apply the carbide-forming metal onto the carbon coating as a metal coating, for example by evaporation or sputtering with lower kinetic energies than the formation energy of the metal carbide, and then to react the metal chemically with the carbon by means of a heat treatment. Tungsten (W), titanium (Ti), tantalum (Ta), boron (B), aluminum (Al), nickel (Ni), or scandium (Sc) can, for example, be used as carbide-forming metals.

In a further embodiment, the SiC surface is exposed, before creation of the carbon coating, to a hydrogen atmosphere at temperatures of at least 500° C. This results in a SiC surface that is essentially free of oxygen.

DETAILED DESCRIPTION OF DRAWINGS

Figure 1:
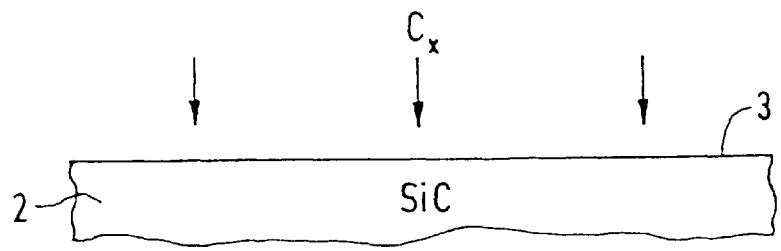
Figure 2:
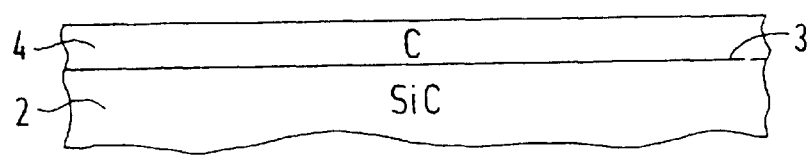
Figure 3:
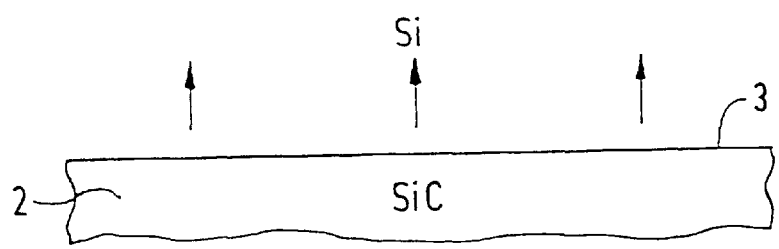
Figure 4:
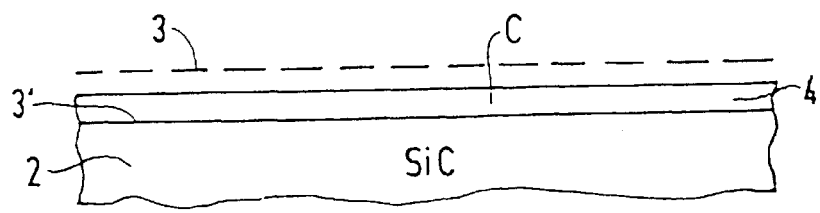
Figure 5:
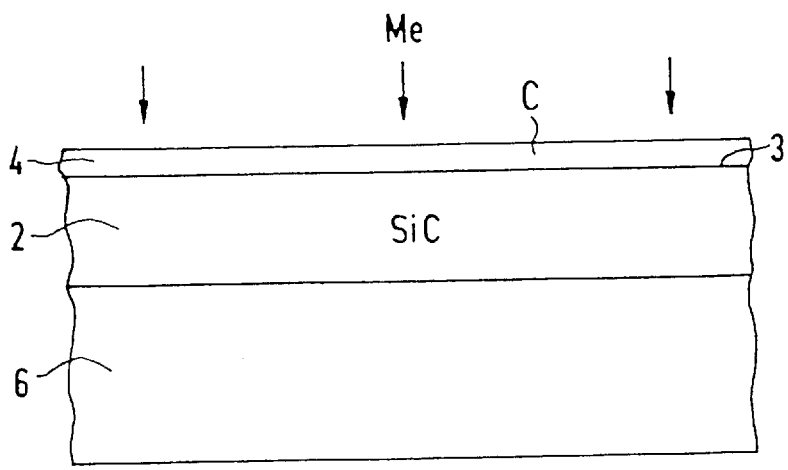
Figure 6:
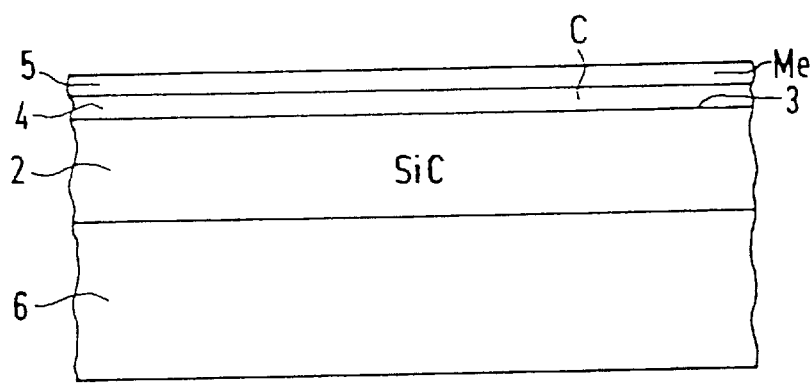
Figure 7:
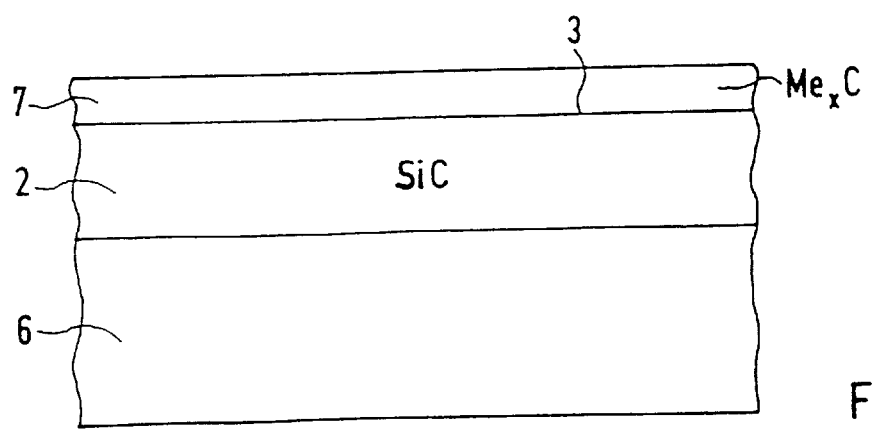

For further explanation of the invention, reference is made to the drawings, in which FIGS. 1 and 2 schematically depict a first implementation approach for producing a carbon coating on a SiC surface;

FIGS. 3 and 4 schematically depict a second implementation approach for producing a carbon coating on a SiC surface; and FIGS. 5, 6, 7 schematically depict two implementation approaches for converting the carbon coating into a metal carbide coating on the SiC surface as an electrical contact.

Parts corresponding to one another are given the same reference characters.

In all the embodiments depicted, a SiC single crystal is labeled 2, and a SiC surface of said SiC single crystal 2 is labeled 3.

As shown in FIG. 1, carbon C, is delivered to SiC surface 3 in elemental form C, for example by sputtering, or in the form of a chemical carbon compound, for example by CVD or MEE.

As depicted in FIG. 2, a carbon coating 4 is deposited on SiC surface 3 from the delivered carbon CX. In a CVD process or MBE process, a hydrocarbon gas such as, for example, $C_2H_2$ is generally used, from which—when process conditions such as, in particular, pressure and temperature are established appropriately—carbon coating 4 forms by chemical reactions in the vicinity of SiC surface 3. Typical process temperatures lie, in this context, between 500° C. and 1500° C.

In another embodiment depicted in FIG. 3, on the other hand, silicon atoms bound in the SiC crystal lattice are removed, preferably evaporated off, from SiC surface 3. In order to evaporate (sublime) the silicon atoms off, SiC surface (3) is preferably subjected to a heat treatment at temperatures of at least 1000° C., preferably in a vacuum or in an inert gas atmosphere. An "inert gas" is in this context understood to mean a gas that practically does not react chemically with SiC at the temperatures used, for example argon (Ar). Since the vapor pressure of silicon (Si) in the SiC is higher than the vapor pressure of the carbon (C), an excess of carbon atoms remains behind when the silicon atoms evaporate off at the SiC surface.

These excess carbon atoms form into a carbon coating 4 that is shown in FIG. 4. The result is a new, slightly set-back SiC surface 3' which adjoins carbon coating 4. The previous SiC surface 3 prior to removal of the silicon atoms is shown in FIG. 4 with dashed lines.

Both by delivering carbon in accordance with FIGS. 1 and 2, and also by evaporating silicon in accordance with FIGS. 3 and 4, a carbon coating 4 is therefore produced at SiC surface 3 or 3'. Carbon coating 4 can, for example, be produced with a substantially amorphous structure and preferably with a graphite structure or at least a graphite-like structure. In an advantageous embodiment, a carbon coating 4 less than 1 nm thick is produced.

In a particularly advantageous embodiment of the method, one of the basal planes, i.e. the silicon plane or the carbon plane, of SiC single crystal 2 is used as SiC surface 3. The silicon plane corresponds to a (1 1 1) crystal surface in the basal crystal lattice for a SiC single crystal 2 of the 3C cubic polytype (β-SiC), and to a (0 0 0 1) crystal surface in the basal crystal lattice of a SiC single crystal of a non-cubic polytype such as, for example, 4H, 6H, or 15R (α-SiC). The carbon plane is understood, on the other hand, to be a (−1 −1 −1) crystal surface in the basal crystal lattice for a SiC single crystal 2 of the 3C cubic polytype (β-SiC), and a (0 0 −1) crystal surface in the basal crystal lattice for a SiC single crystal of a non-cubic polytype such as, for example, 4H, 6H, or 15R (α-SiC).

In this embodiment of the method, carbon coating 4 is preferably created by evaporating silicon atoms from SiC surface 3. For this purpose the silicon plane or the carbon plane of SiC single crystal 3 is subjected to a heat treatment (already described). By way of the time profile of the heat treatment and the temperatures used, it is possible to establish very precisely how many individual (1 1 1) or (0 0 0 1) silicon atom layers are removed from the SiC crystal lattice. In addition and in particular, only the topmost silicon atom layer can be removed. This then yields, on the silicon plane, a carbon coating 4 made up of only a monolayer of carbon atoms, and on the carbon plane, a carbon coating 4 made up of two carbon atom layers. The carbon remaining behind on the surface generally rearranges, by saturation of open bonds, into a graphite structure (graphitization). Evaporation of silicon atoms from the silicon plane or the carbon plane of a SiC single crystal with various heat treatments, and spectrographic examinations of the resulting carbon coatings, are described in the article Muehlhoff et al., "*Comparative electron spectroscopic studies of surface segregation on SiC (0 0 0 1) and SiC (0 0 0 −1),*" *Journal of Applied Physics*, Vol. 60, No. 8, 15 October 1986, pages 2842 to 2853, the content of which is incorporated into the disclosure of this application.

FIGS. 5 to 7 illustrate two implementation approaches for producing an electrical contact on SiC surface 3 by converting carbon coating 4 created on SiC surface 3 into a metal carbide coating 7. Both implementation approaches proceed from a structure having a carbon coating 4, created on SiC surface 3, as shown in one of FIG. 2, FIG. 4, or FIG. 5. As shown in FIG. 5, at least one carbide-forming metal, labeled Me, is delivered to carbon coating 4. Preferably the metal Me is brought to carbon coating 4 by a sputtering process or by thermal evaporation.

In the first implementation approach, the energy of the metal atoms or metal ions striking carbon coating 4 is set to be less than the chemical formation energy for formation of a metal carbide $Me_xC$ between the metal Me and the carbon C of carbon coating 4. As shown in FIG. 6, a separate metal coating 5 of metal Me is then first deposited on carbon coating 4. Said metal coating 5 is then, preferably by means of a heat treatment, chemically converted with carbon coating 4 into a metal carbide coating 7. The temperature and thus the thermal energy during the heat treatment are, in this context, set to be sufficiently high to allow formation of the metal carbide $Me_xC$.

In the second implementation approach, on the other hand, the energy of the metal atoms or metal ions arriving at carbon coating 4 is set to be at least as high as the chemical formation energy of the associated metal carbide $Me_xC$, for example by means of a sufficiently high acceleration voltage in the sputtering process. In this case, as shown in FIG. 7, a metal carbide coating 7 forms directly—without formation of a metal coating as in the first implementation approach—on carbon coating 4 upon application of the at least one metal Me.

Preferably the stoichiometric ratio of metal Me to carbon C of carbon coating 4 is set so that at least approximately all the carbon C of carbon coating 4 reacts with the metal Me to form metal carbide $Me_xC$. It is also possible, however, to convert only a portion of the carbon C.

Tungsten (W), titanium (Ti), tantalum (Ta), boron (B), aluminum (Al), nickel (Ni), or scandium (Sc) can, for example, be used as carbide-forming metals. The corresponding metal carbides $Me_xC$ are then $W_2C$, TiC, TaC or $Ta_2C$, $B_4C$, $Al_4C_3$, $Ni_3C$, or $Sc_2C$.

A Schottky contact, which is used in particular for a SiC-based Schottky diode, is preferably produced with the method as defined by the invention. The silicon carbide/metal carbide interface produced with the method has an almost ideal contact barrier and thus comparatively low leakage currents even at high blocking voltages between SiC single crystal 2 and metal carbide coating 7.

In the embodiment depicted in FIG. 5, SiC single crystal 2 is arranged on a substrate 6 in the form of a coating, and is preferably grown on substrate 6, in a manner known per se, by means of a CVD process or an MBE process, in particular by atomic layer epitaxy, at temperatures between approximately 1000° C. and approximately 1800° C., or also by sublimation growth at temperatures generally between approximately 2000° C. and approximately 2300° C. Substrate 6 preferably also consists of SiC. It is also possible, however, to use a SiC single crystal 2 grown by means of a sublimation process.

If SiC single crystal 2 is produced by CVD or MBE, carbon coating 4 can be grown on SiC surface 3 by interrupting silicon delivery to the growing SiC single crystal during the CVD or MBE process and delivering only carbon. In addition, carbon coating 4 can be also be created by cooling SiC single crystal 2 immediately after the CVD or MBE process, in vacuum or in an inert gas atmosphere, generally to room temperature in accordance with a defined temperature profile.

Although a surface of a SiC single crystal was used in the embodiments of the methods described, the method can nevertheless also be used, in analog fashion, to produce electrical contacts on surfaces of non-single-crystal SiC elements, for example polycrystalline SiC elements, which in particular can be produced by sintering.

What is claimed:

1. A method for producing an electrical contact on a silicon carbide surface (3), comprising the steps of:
   a) producing by epitaxial deposition a SiC crystal (2) having said silicon carbide surface (3);
   b) producing a carbon coating (4) on said silicon carbide surface (3) by interrupting silicon delivery during said epitaxial deposition and by delivering only carbon; and
   c) converting the carbon coating (4) at least largely into metal carbide with at least one carbide-forming metal.

2. The method as defined in claim 1, wherein the SiC single crystal (2) and the carbon coating (4) are produced by chemical vapor deposition.

3. The method as defined in claim 1, wherein the SiC single crystal (2) and the carbon coating (4) are produced by molecular beam epitaxy.

4. The method as defined in claim 1, wherein the silicon carbide surface (3) is formed with a silicon plane of the SiC single crystal (2) that corresponds in the case of a cubic polytype of SiC (β-SiC) to a (1 1 1) crystal surface, and that corresponds in the case of a non-cubic polytype (α-SiC) to a (0 0 0 1) crystal surface.

5. The method as defined in claim 1, wherein the silicon carbide surface (3) is formed with a carbon plane of the SiC single crystal (2) that corresponds in the case of a cubic polytype of SiC (β-SiC) to a (−1 −1 −1) crystal surface, and that corresponds in the case of a non-cubic polytype (α-SiC) to a (0 0 0 −1) crystal surface.

6. The method as defined in claim 1, wherein the carbon coating (4) has a substantially graphite crystalline structure or a graphite-like crystalline structure.

7. The method as defined in claim 1, wherein the carbon coating (4) is created to have a thickness of less than 1 nm.

8. The method as defined in claim 1, wherein an element selected from the group consisting of tungsten (W), titanium (Ti), tantalum (Ta), boron (B), aluminum (Al), nickel (Ni), and scandium (Sc) is used as the carbide-forming metal.

9. The method as defined in claim 1, wherein the at least one carbide-forming metal is brought to the carbon coating (4) by sputtering.

10. The method as defined in claim 9, wherein the kinetic energy of the metal atoms or metal ions is set to be at least as great as the chemical formation energy of the associated metal carbide.

11. The method as defined in claim 1, wherein the carbide-forming metal is first applied onto the carbon coating (4) and then caused to react chemically with the carbon by means of a temperature treatment.

12. The method as defined in claim 11, wherein the carbide-forming metal is evaporated onto the carbon coating (4).

13. A method for producing an electrical contact on a silicon surface (3), comprising the steps of:
   a) producing a SiC crystal (2) by epitaxial deposition at a temperature between approximately 1000° C. and approximately 1800° C. said SiC single crystal (2) having said silicon carbide surface (3), immediately followed by
   b) cooling the SiC single crystal (2) in vacuum or in an inert gas atmosphere, wherein the carbon coating (4) is produced by evaporating silicon atoms off from said silicon carbide surface (3), and
   c) converting the carbon coating (4) at least largely into metal carbide with at least one carbide-forming metal.

14. The method as defined in claim 13, wherein the SiC single crystal (2) is produced by chemical vapour deposition.

15. The method as defined in claim 13, wherein the SiC single crystal (2) is produced by molecular beam epitaxy.

16. The method as defined in claim 13, wherein the silicon carbide surface (3) is formed with a silicon plane of the SiC single crystal (2) that corresponds in the case of a cubic polytype of SiC (β-SiC) to a (1 1 1) crystal surface, and that corresponds in the case of a non-cubic polytype (α-SiC) to a (0 0 0 1) crystal surface.

17. The method as defined in claim 13, wherein the silicon carbide surface (3) is formed with a carbon plane of the SiC single crystal (2) that corresponds in the case of a cubic polytype of SiC (β-SiC) to a (−−1 −1 −1) crystal surface, and that corresponds in the case of a non-cubic polytype (α-SiC) to a (0 0 0 −1) crystal surface.

18. The method as defined in claim 13, wherein the carbon coating (4) has a substantially graphite crystalline structure or a graphite-like crystalline structure.

19. The method as defined in claim 13, wherein the carbon coating (4) is created to have a thickness of less than 1 nm.

20. The method as defined in claim 13, wherein an element selected from the group consisting of tungsten (W), titanium (Ti), tantalum (Ta), boron (B), aluminum (Al), nickel (Ni), and scandium (Sc) is used as the carbide-forming metal.

21. The method as defined in claim 13, wherein the at least one carbide-forming metal is brought to the carbon coating (4) by sputtering.

22. The method as defined in claim 21, wherein the kinetic energy of the metal atoms or metal ions is set to be at least as great as the chemical formation energy of the associated metal carbide.

23. The method as defined in claim 13, wherein the carbide-forming metal is first applied onto the carbon coating (4) and then caused to react chemically with the carbon by means of a temperature treatment.

24. The method as defined in claim 23, wherein the carbide-forming metal is evaporated onto the carbon coating (4).

* * * * *